(12) United States Patent
Ning et al.

(10) Patent No.: US 9,329,645 B2
(45) Date of Patent: May 3, 2016

(54) SERVER SYSTEM

(71) Applicants: Inventec (Pudong) Technology Corporation, Shanghai (CN); INVENTEC CORPORATION, Taipei (TW)

(72) Inventors: Qi-Guang Ning, Shanghai (CN); Ji-Peng Xu, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 502 days.

(21) Appl. No.: 13/748,240

(22) Filed: Jan. 23, 2013

(65) Prior Publication Data

US 2014/0085801 A1    Mar. 27, 2014

(30) Foreign Application Priority Data

Sep. 21, 2012  (CN) .......................... 2012 1 0353129

(51) Int. Cl.
    *G06F 1/18*    (2006.01)
    *G06F 1/20*    (2006.01)
    *H05K 7/14*    (2006.01)

(52) U.S. Cl.
    CPC  *G06F 1/20* (2013.01); *G06F 1/189* (2013.01); *H05K 7/1492* (2013.01)

(58) Field of Classification Search
    CPC ........... G06F 1/188; G06F 1/189; G06F 1/22; G06F 1/266; G06F 1/20; H05K 7/1492
    USPC .......... 361/724, 725, 727; 211/26; 312/223.1, 312/223.2
    See application file for complete search history.

(56) References Cited

U.S. PATENT DOCUMENTS

| | | | |
|---|---|---|---|
| 8,737,090 B2 * | 5/2014 | Jai ................................. | 361/826 |
| 2011/0013348 A1 * | 1/2011 | Seibold et al. ........... | 361/679.02 |
| 2011/0116213 A1 * | 5/2011 | Tai et al. .................. | 361/679.01 |
| 2012/0039032 A1 * | 2/2012 | Archibald et al. ....... | 361/679.02 |
| 2013/0017693 A1 * | 1/2013 | Li et al. ......................... | 439/110 |
| 2013/0039002 A1 * | 2/2013 | Li et al. .................... | 361/679.48 |
| 2013/0039005 A1 * | 2/2013 | Li et al. .................... | 361/679.48 |
| 2013/0107436 A1 * | 5/2013 | Li et al. ....................... | 361/679.4 |

\* cited by examiner

*Primary Examiner* — Hoa C Nguyen
*Assistant Examiner* — Christopher L Augustin
(74) *Attorney, Agent, or Firm* — Locke Lord LLP; Tim Tingkang Xia, Esq.

(57) ABSTRACT

A server system includes a rack, multiple servers, an electrically conductive component, a switch, a rack management controller and a power supply. The rack has a first storage area, a middle storage area and a second storage area. The servers are positioned in the first storage area and the second storage area. The electrically conductive component is installed inside the rack and includes a first power supply part disposed in the first storage area and a second power supply part disposed in the second storage area. The switch is installed in the middle storage area. The rack management controller is installed in the middle storage area. The power supply, installed in the middle storage area, is electrically connected to the rack management controller and the switch which is disposed farther away from the electrically conductive component than the power supply.

7 Claims, 5 Drawing Sheets

SERVER SYSTEM

CROSS-REFERENCE TO RELATED APPLICATIONS

This non-provisional application claims priority under 35 U.S.C. §119(a) on Patent Application No(s). 201210353129.1 filed in China on Sep. 21, 2012, the entire contents of which are hereby incorporated by reference.

BACKGROUND OF THE INVENTION

1. Technical Field of the Invention

The present disclosure relates to an electronic device, and more particularly to a server system.

2. Description of the Related Art

Nowadays, the information technology is under a rapid development era. Computers, such as desktop or laptop, are widely used by corporations and individuals to handle various tasks. As the communication technology becomes highly developed, regional business transaction being replaced by transnational electronic commerce has already become a development trend. Common personal computers can no longer meet the business requirements of corporations. Therefore, computer companies have developed various specialized server systems such as rack server system, blade server system and tower server system, etc., in order to solve the problems of the electronic commerce for corporations.

Take rack server system as an example, a rack server system comprises a cabinet and a plurality of servers installed inside the cabinet. Moreover, the rack server system can save space and is convenient for management, so the servers are collaborated to perform large scale computing. However, when assembly workers have to assemble a server system, large amount of cables is required for connecting the components inside the server system in order that the server system can operate normally. As a result, the cost of the cables for assembling the server system is expensive. Therefore, it is highly demanded for reducing the cost of cables required in assembling the server system.

SUMMARY OF THE INVENTION

The server system disclosed in the present disclosure comprises a rack, a plurality of servers, an electrically conductive component, a switch, a rack management controller and a power supply. The rack has a first storage area, a middle storage area and a second storage area. The middle storage area is disposed between the first storage area and the second storage area. The plurality of servers are positioned in the first storage area and the second storage area. The electrically conductive component is installed inside the rack. The electrically conductive component comprises a first power supply part and a second power supply part. The first power supply part is disposed in the first storage area and the second power supply part is disposed in the second storage area. The electrically conductive component provides electricity for the servers through the first power supply part and the second power supply part. The switch is installed in the middle storage area. The rack management controller is installed in the middle storage area. The power supply is installed in the middle storage area. The power supply is electrically connected to the rack management controller and the switch. The power supply is disposed between the switch and the rack management controller. The switch is disposed farther away from the electrically conductive component than the power supply. The power supply provides power for the servers through the first power supply part and the second power supply part.

BRIEF DESCRIPTION OF THE DRAWINGS

The present disclosure will become more fully understood from the detailed description given herein below for illustration only, and thus are not limitative of the present disclosure, and wherein.

DETAILED DESCRIPTION

The detailed features and advantages of the disclosure are described below in great detail through the following embodiments, the content of the detailed description is sufficient for those skilled in the art to understand the technical content of the present disclosure and to implement the disclosure there accordingly. Based upon the content of the specification, the claims, and the drawings, those skilled in the art can easily understand the relevant objectives and advantages of the disclosure.

Figure 1:
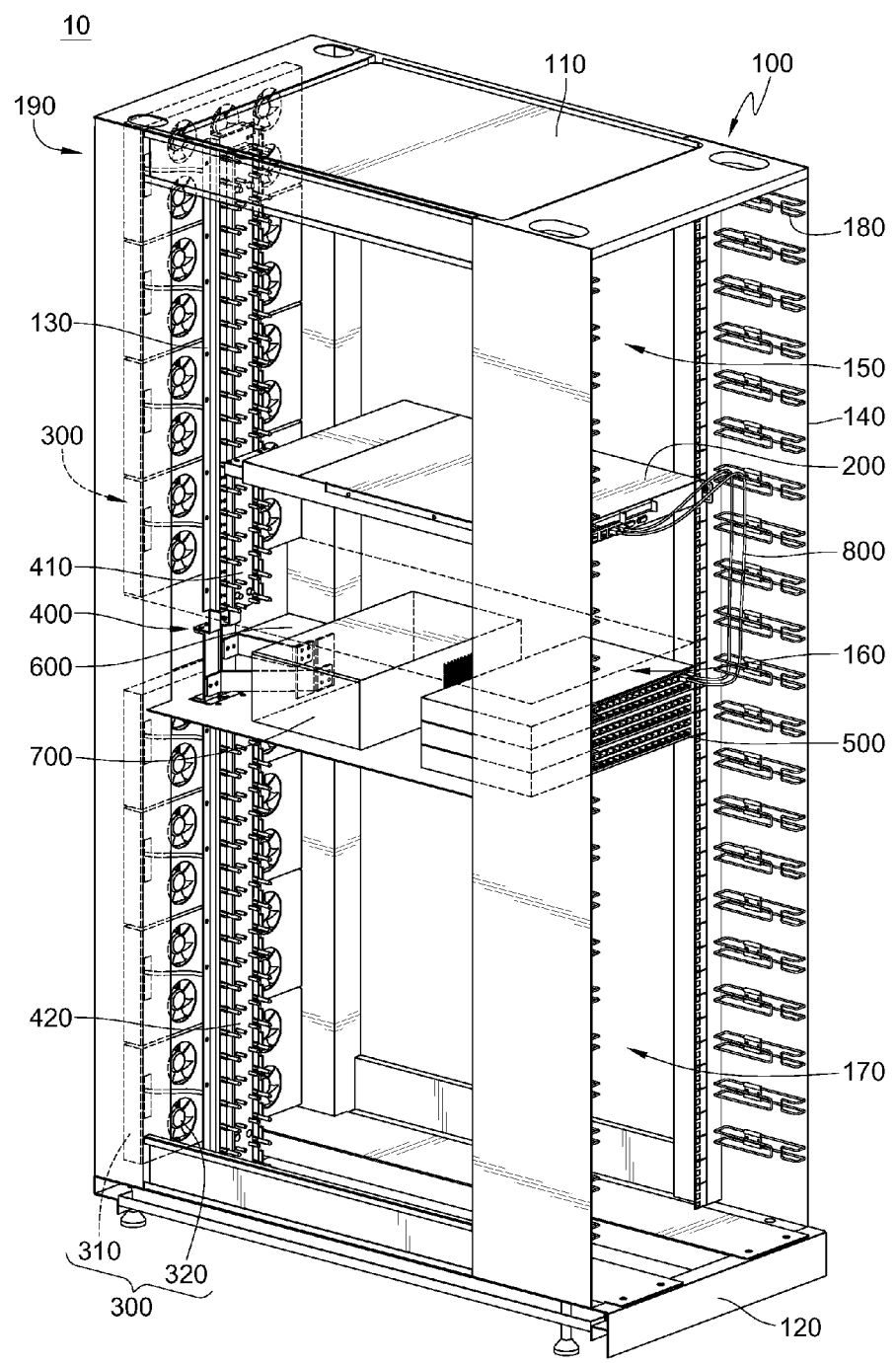
FIG. 1 is a perspective view of a server system according to an embodiment of the disclosure.
Figure 2:
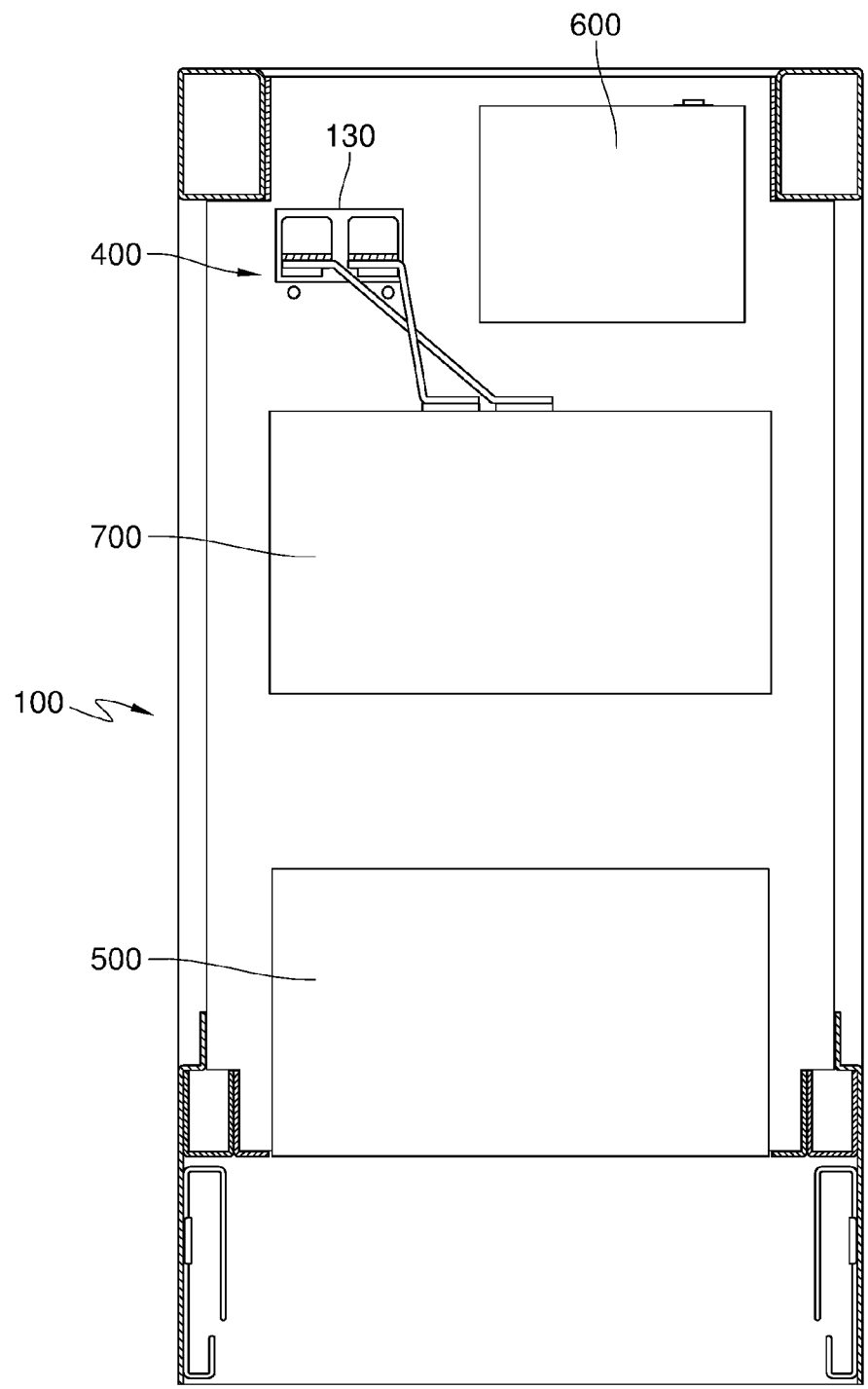
FIG. 2 is an illustration of the positions of a switch, a power supply and a rack management controller disposed in a middle storage area in FIG. 1.
Figure 3:
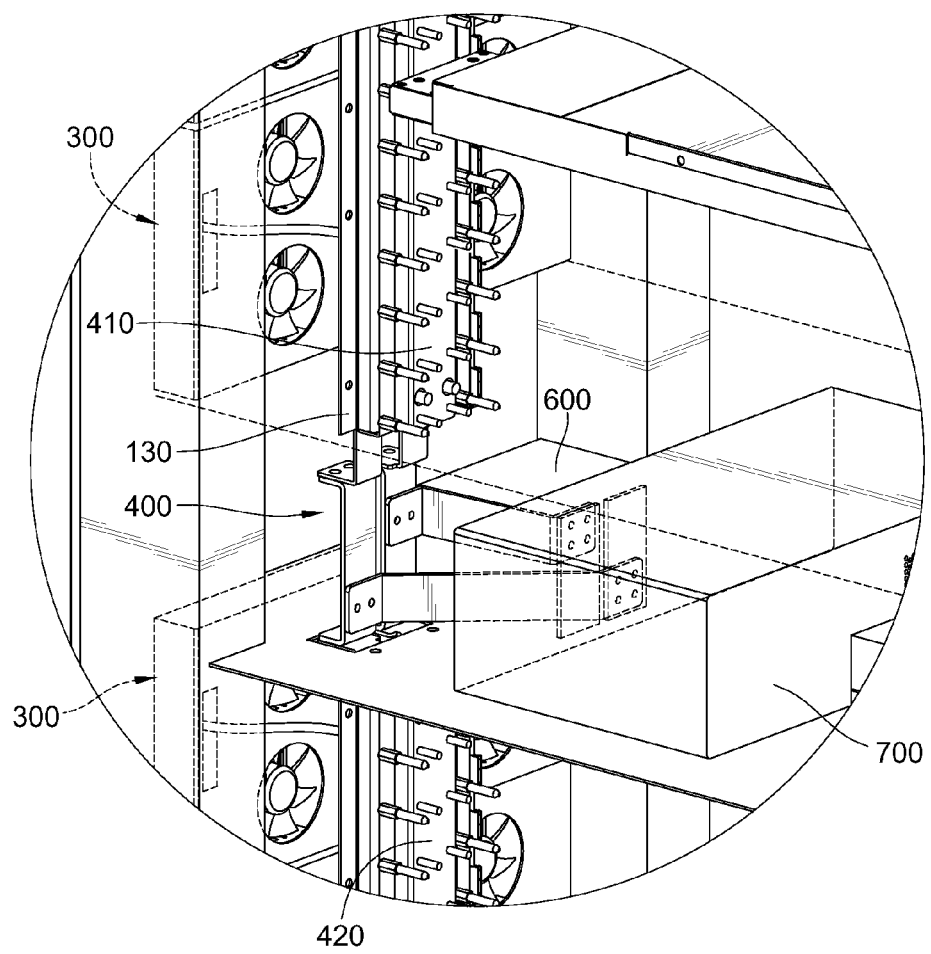
FIG. 3 is a partial enlarged perspective view in FIG. 1.
Figure 4:
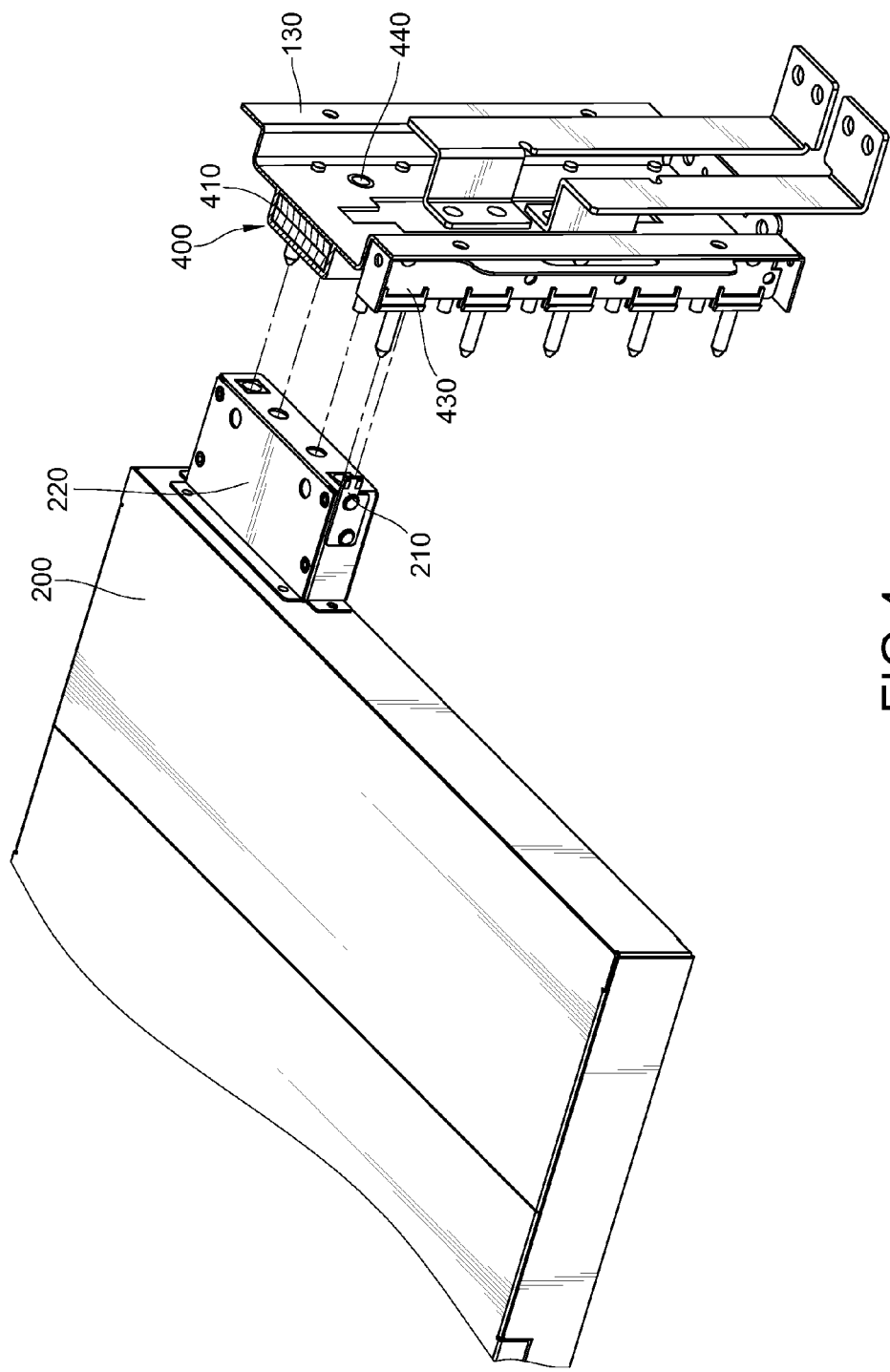
FIG. 4 is an exploded perspective view of an electrically conductive component and a server in FIG. 1.

Please refer to FIGS. 1 to 4. FIG. 1 is a perspective view of a server system according to an embodiment of the disclosure; FIG. 2 is an illustration of the positions of a switch, a power supply and a rack management controller disposing in a middle storage area in FIG. 1; FIG. 3 is a partial enlarged perspective view in FIG. 1; and FIG. 4 is an exploded perspective view of an electrically conductive component and a server in FIG. 1.

A server system 10 of this embodiment comprises a rack 100, a plurality of servers 200 (only one server is shown in the drawings), an electrically conductive component 400, a switch 500, a rack management controller 600 and a power supply 700. In this embodiment and other embodiments, the server system 10 further comprises two fan components 300.

The rack 100 comprises a top plate 110, a bottom plate 120 and a bracket 130. The bracket 130 is connected to the top plate 110 and the bottom plate 120. The rack 100 has a first storage area 150, a middle storage area 160 and a second storage area 170. The middle storage area 160 is disposed between the first storage area 150 and the second storage area 170. In this embodiment, the first storage area 150 is closer to the top plate 110 than the second storage area 170, but is not limited to the present disclosure.

Furthermore, the rack 100 has a front side 140 and a rear side 190 disposed oppositely to each other. The front side 140 is connected to the top plate 110 and the bottom plate 120. The rear side 190 is connected to the top plate 110 and the bottom plate 120. The first storage area 150, the middle storage area 160 and the second storage area 170 are disposed between the front side 140 and the rear side 190.

Generally, the server system 10 is used for installing a plurality of the servers 200. In this embodiment, only one of the servers 200 is used as an example. But the number of the server(s) 200 does not limit to the present disclosure. The server 200 of this embodiment is installed inside the rack 100 and in the first storage area 150. But in other embodiments, the server 200 can be installed in the second storage area 170 (not shown).

The two fan components 300 are installed near the rear side 190 inside the rack 100. The two fan components 300 are disposed in the first storage area 150 and the second storage area 170 respectively. In this embodiment, the fan component 300 comprises a frame element 310 and a plurality of fans 320. The plurality of fans 320 are installed on the frame element 310.

The electrically conductive component 400 is installed on the bracket 130 of the rack 100. The electrically conductive component 400 comprises a first power supply part 410 and a second power supply part 420. The first power supply part 410 is disposed in the first storage area 150, and the second power supply part 420 is disposed in the second storage area 170.

The switch 500 is installed inside the rack 100 and in the middle storage area 160. The switch 500 is used for connecting signal cables 800.

The rack management controller 600 is installed inside the rack 100 and in the middle storage area 160. One of the functions of the rack management controller 600 is for determining the position of the server 200 in the rack 100. In this embodiment and other embodiments, the electrically conductive component 400 comprises a plurality of first electrical connectors 430. The first electrical connectors 430 are electrically connected to the rack management controller 600. Also, the first electrical connectors 430 are disposed in the first storage area 150 and the second storage area 170, respectively. The position of the first electrical connectors 430 is about that the first electrical connector 430 is in which row of the rack 100. The position of each of the first electrical connectors 430 is determined in the rack 100. Each of the first electrical connectors 430 is corresponding to an area for the one sever 200 to position. The rack management controller 600 determines the position of the one server 200 in the rack 100 according to the position of the one of the first electrical connectors 430 which is electrically connected to the one server 200. Each server 200 comprises a second electrical connector 210 and a power input port 220. The power input port 220 of each server 200 is electrically connected to the power supply 700, so as to transmit power for each server 12. The first electrical connectors 430 can be detachably connected to the second electrical connector 210. With the one server 200 installed into the rack 100, both the power input port 220 and the second electrical connector 210 of the one server 200 joint with the electrically conductive component 400 and one of the first electrical connectors 430, respectively. Also, with the one server 200 removed from the rack 100, both the power input port 220 and the second electrical connector 210 of the one server 200 are separated from the electrically conductive component 400 and the one of the first electrical connectors 430, respectively. The rack management controller 600 determines the position of the server 200 in the first storage area 150 depending on the position of the second electrical connector 210 of the server 200 which is connected to the first electrical connectors 430. The position of the server 200 is about that the server 200 is in which row of the rack 100.

Furthermore, in this embodiment and other embodiments, the electrically conductive component 400 further comprises two third electrical connectors 440 disposed on the bracket 130. The two third electrical connectors 440 and the first electrical connectors 430 are respectively disposed on two opposite sides of the electrically conductive component 400. The two fan components 300 are respectively electrically connected to the two third electrical connectors 440.

The power supply 700 is installed inside the rack 100 as well as in the middle storage area 160. The power supply 700 is electrically connected to the switch 500 and the rack management controller 600. The power supply 700 is disposed between the switch 500 and the rack management controller 600. Furthermore, the switch 500 is disposed farther away from the electrically conductive component 400 than the power supply 700. In other words, the switch 500 is near the front side 140 of the rack 100, and the rack management controller 600 is near the rear side 190 of the rack 100.

The power supply 700 is electrically connected to the first power supply part 410 and the second power supply part 420. In this embodiment, because the one server 200 is installed in the first storage area 150 and is electrically connected to the first power supply part 410, the power of the power supply 700 is transmitted to the one server 200 through the first power supply part 410. In other embodiments, a plurality of the servers 200 can be installed in the first storage area 150 and the second storage area 170, respectively. The servers 200 in the first storage area 150 are electrically connected to the first power supply part 410, and the servers 200 in the second storage area 170 are electrically connected to the second power supply part 420. The power of the power supply 700 is transmitted to each of the servers 200 through the first power supply part 410 and the second power supply part 420 respectively. Therefore, the power supply 700 may provide power for each of the servers 200.

Furthermore, the power supply 700 is electrically connected to the third electrical connectors 440 of the electrically conductive component 400 to drive the two fan components 300 to operate in order to dissipate the heat of the servers 200 in the first storage area 150 and the second storage area 170.

Please refer to FIG. 2 for the detailed positions of the switch 500, the rack management controller 600 and the power supply 700. The power supply 700 of this embodiment is disposed between the electrically conductive component 400 and the switch 500, and the rack management controller 600 is disposed between the fan components 300 and the power supply 700. In this embodiment, because the power supply 700 is removed backward to be disposed behind the switch 500, the power supply 700 is much closer to the electrically conductive component 400, the rack management controller 600 and the fan components 300. Furthermore, the number of connecting cables between the power supply 700 and that comprising the electrically conductive component 400, the rack management controller 600 and the fan components 300 is larger than the number of the connecting cables between the power supply 700 and the switch 500. Therefore, when the power supply 700 is removed backward to be disposed behind the switch 500, the length of connecting cables between the power supply 700 and that comprising the electrically conductive component 400, the rack management controller 600 and the fan components 300 can be shortened. Therefore, the cost of cables required for assembling the server system 10 can be reduced.

Figure 5:
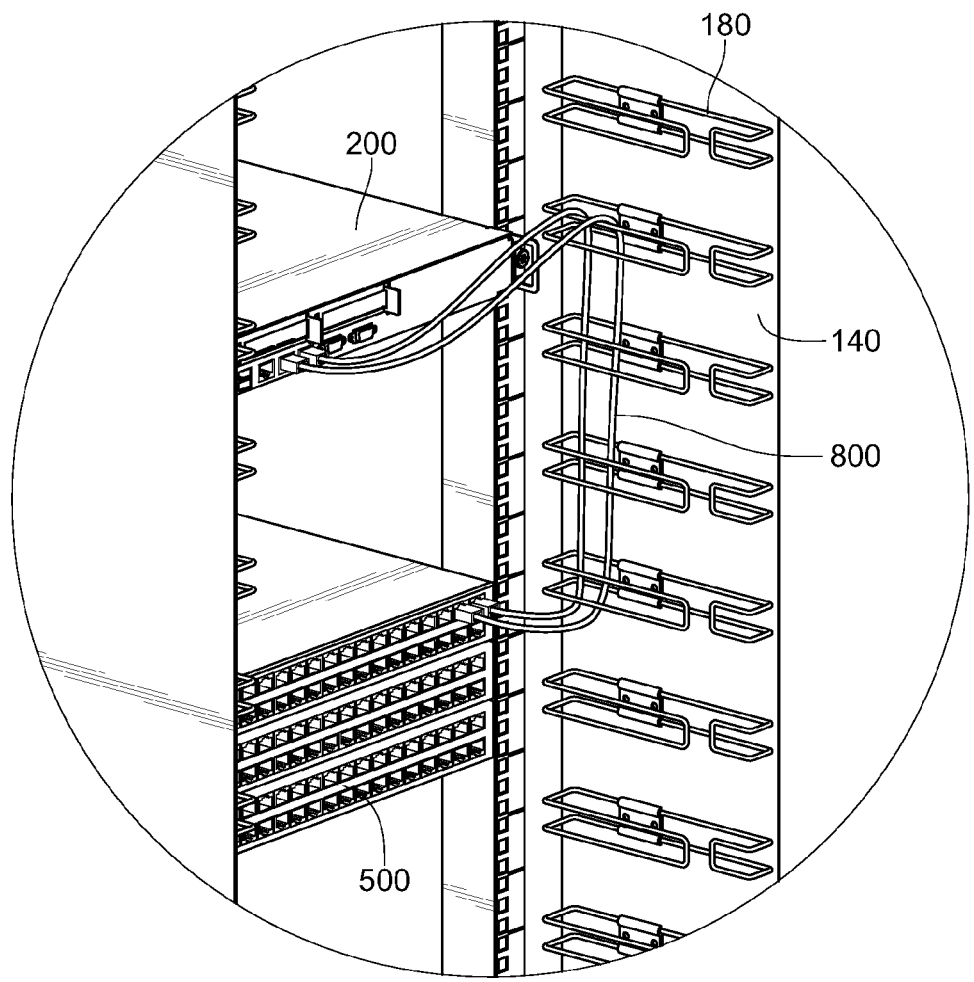
FIG. 5 is a partial enlarged view in FIG. 1.

Furthermore, please refer to FIG. 5, which is a partial enlarged view in FIG. 1. In this embodiment and other embodiments, the rack 100 further comprises a plurality of cable arrangement structures 180. The cable arrangement structures 180 are disposed at the front side 140 of the rack 100 near the switch 500. The cable arrangement structures 180 are used for arranging the signal cables 800 connected to the switch 500.

According to the server system disclosed in the above embodiments, by disposing the power supply between the switch and the rack management controller, the distances between the power supply and the other components connected to the power supply can be shortened in order to reduce the cost of the cables required for assembling the server system.

Furthermore, because the power supply is independently disposed in the middle storage area and the power supply provides electricity for the servers through the electrically conductive component, the power supply can be replaced at one time to solve the power problem when the power system of the server system fails.

Furthermore, the fan components are independently disposed inside the rack instead of disposing inside the servers. Thus, when the fan components are failure, the assembly workers can replace the fan components disposing inside the rack directly without having to take out the servers. Therefore, the time required for maintaining the fan components can be reduced.

Furthermore, the electrically conductive component comprises the first electrical connector, and the server comprises the second electrical connector. Therefore, when the server is installed inside the rack, the rack management controller can determine the position of the server in the rack by the connection between the first electrical connector and the second electrical connector.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A server system, comprising:
   a rack having a first storage area, a middle storage area and a second storage area, the middle storage area being disposed between the first storage area and the second storage area;
   a plurality of servers positioned in the first storage area and the second storage area;
   an electrically conductive component installed inside the rack, the electrically conductive component comprising a first power supply part and a second power supply part, wherein the first power supply part is disposed in the first storage area and the second power supply part is disposed in the second storage area;
   a switch installed in the middle storage area;
   a rack management controller installed in the middle storage area, and the rack management controller comprising a function for determining positions of the servers in the rack; and
   a power supply installed in the middle storage area, wherein the power supply is electrically connected to the rack management controller and the switch respectively;
   wherein the power supply is disposed between the switch and the rack management controller, and the switch is disposed farther away from the electrically conductive component than the power supply; and
   wherein the power supply provides power for the servers through the first power supply part and the second power supply part.

2. The server system as claimed in claim 1, further comprising two fan components disposed in the first storage area and the second storage area, respectively; the electrically conductive component being disposed between the two fan components and the power supply, and the power supply being electrically connected to the two fan components through the first power supply part and the second power supply part to drive the two fan components to operate.

3. The server system as claimed in claim 2, wherein the rack further comprises a top plate and a bottom plate, wherein the first storage area, the middle storage area and the second storage area are all formed between the top plate and the bottom plate.

4. The server system as claimed in claim 3, wherein the rack further comprises a plurality of cable arrangement structures; the cable arrangement structures are disposed on a front side of the rack near the switch; and the front side is connected to the top plate and the bottom plate.

5. The server system as claimed in claim 3, wherein the rack further comprises a bracket; the bracket is connected to the top plate and the bottom plate and is disposed between the two fan components and the power supply; and the first power supply part and the second power supply part are disposed on the bracket.

6. The server system as claimed in claim 5, wherein the electrically conductive component further comprises a plurality of first electrical connectors disposed on the bracket and each electrically connected to the rack management controller respectively, each server further comprises a power input port and a second electrical connector; with one of the servers installed into the rack, both the power input port and the second electrical connector of the one of the servers joint with the electrically conductive component and one of the first electrical connectors, respectively, and with the one of the servers removed from the rack, both the power input port and the second electrical connector both of the one of the servers are separated from the electrically conductive component and the one of the first electrical connectors, respectively; the rack management controller determines the position of the one server in the rack according to the position of the one of the first electrical connectors which is electrically connected to the one of the servers.

7. The server system as claimed in claim 6, wherein the electrically conductive component further comprises two third electrical connectors disposed on the bracket, wherein the two fan components are electrically connected to the two third electrical connectors, respectively.

* * * * *